United States Patent
Yeh et al.

(10) Patent No.: US 10,411,652 B2
(45) Date of Patent: Sep. 10, 2019

(54) AMPLIFIER BIAS TECHNIQUE

(71) Applicant: QUALCOMM Incorporated, San Diego, CA (US)

(72) Inventors: Yu-Ching Yeh, Santa Clara, CA (US); Sean Joel Lyn, Cupertino, CA (US); Cheng-Han Wang, San Jose, CA (US); Roger Brockenbrough, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/909,840

(22) Filed: Mar. 1, 2018

(65) Prior Publication Data

US 2019/0028061 A1    Jan. 24, 2019

Related U.S. Application Data

(60) Provisional application No. 62/535,571, filed on Jul. 21, 2017.

(51) Int. Cl.
| | |
|---|---|
| *H03F 3/45* | (2006.01) |
| *H03F 1/02* | (2006.01) |
| *H03F 3/24* | (2006.01) |
| *H03F 3/195* | (2006.01) |
| *H03F 3/193* | (2006.01) |

(52) U.S. Cl.
CPC ........... *H03F 1/0266* (2013.01); *H03F 3/193* (2013.01); *H03F 3/195* (2013.01); *H03F 3/245* (2013.01); *H03F 2200/18* (2013.01); *H03F 2200/451* (2013.01)

(58) Field of Classification Search
CPC .... H03F 3/26; H03F 3/45; H03F 2003/45022; H03F 2003/4504

USPC ................ 330/255, 258, 259, 264, 265, 267
See application file for complete search history.

(56) References Cited

U.S. PATENT DOCUMENTS

| | | | |
|---|---|---|---|
| 6,545,538 B1 | 4/2003 | Ivanov et al. | |
| 7,786,800 B2 | 8/2010 | Chang | |
| 8,030,999 B2 | 10/2011 | Chatterjee et al. | |
| 8,067,982 B2 | 11/2011 | Wei | |
| 2010/0102855 A1* | 4/2010 | Takahashi | H03F 3/505 |
| | | | 327/108 |

OTHER PUBLICATIONS

Surkanti P.R., et al., "Converting a Three-Stage Pseudoclass-AB Amplifier to a True-Class-AB Amplifier," IEEE Transactions on Circuits and Systems—II: Express Briefs, vol. 59, No. 4, Apr. 2012, pp. 229-233.

* cited by examiner

*Primary Examiner* — Steven J Mottola
(74) *Attorney, Agent, or Firm* — Qualcomm Incorporated/Seyfarth Shaw LLP; Alan M. Lenkin

(57) ABSTRACT

An amplifier may include a first transistor. The amplifier may also include a second transistor coupled to the first transistor in an output stage of the amplifier. The amplifier may also include a level shift resistor coupled between a gate of the first transistor and a gate of the second transistor. The amplifier may further include a feedback bias circuit coupled to the gate of the first transistor and the gate of the second transistor through the level shift resistor. The feedback bias circuit may be configured to sense a common mode voltage of the output stage of the amplifier, and to compare the common mode voltage with a reference voltage to control a resistor bias current conducted by the level shift resistor.

18 Claims, 11 Drawing Sheets

AMPLIFIER BIAS TECHNIQUE

CROSS-REFERENCE TO RELATED APPLICATION

This application claims the benefit of U.S. Provisional Patent Application No. 62/535,571, filed on Jul. 21, 2017, entitled "CLASS-AB AMPLIFIER BIAS TECHNIQUE," the disclosure of which is expressly incorporated by reference herein in its entirety.

BACKGROUND

Field

The present disclosure relates generally to wireless communication systems and, more specifically, to a bias scheme for an amplifier.

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna. The receive section may amplify and process the received RF signal to recover data sent by a base station.

A bias circuit may be used to establish the parameters under which a communication signal is amplified. Operation of a baseband amplifier may be affected by a reduced supply voltage used in mobile RF transceivers. Correctly biasing the amplifier is desirable so that the communication signal may be appropriately amplified and transmitted to a load. For example, an issue with baseband amplifiers is setting a standing current in an output stage of the amplifiers, particularly when no signal is present to enable low power operation.

SUMMARY

An amplifier may include a first transistor. The amplifier may also include a second transistor coupled to the first transistor in an output stage of the amplifier. The amplifier may also include a level shift resistor coupled between a gate of the first transistor and a gate of the second transistor. The amplifier may further include a feedback bias circuit coupled to the gate of the first transistor and the gate of the second transistor through the level shift resistor. The feedback bias circuit may be configured to sense a common mode voltage of the output stage of the first amplifier, and to compare the common mode voltage with a reference voltage to control a resistor bias current conducted by the level shift resistor.

A method of biasing a baseband amplifier may include sensing a common mode voltage of an output stage of the amplifier. The method may also include comparing the common mode voltage to a reference signal voltage. The method may further include feeding back a control signal according to the comparing to set a resistor bias current.

An amplifier may include a first transistor. The amplifier may also include a second transistor coupled to the first transistor in an output stage of the amplifier. The amplifier may further include a bias circuit coupled to a gate of the first transistor and a gate of the second transistor. The bias circuit may be composed of a resistor between the gate of the first transistor and the gate of the second transistor of the output stage. The bias circuit may include comprising means for sensing a common mode voltage of the output stage of the amplifier and comparing the common mode voltage with a reference signal to control a resistor bias current conducted by the level shift resistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
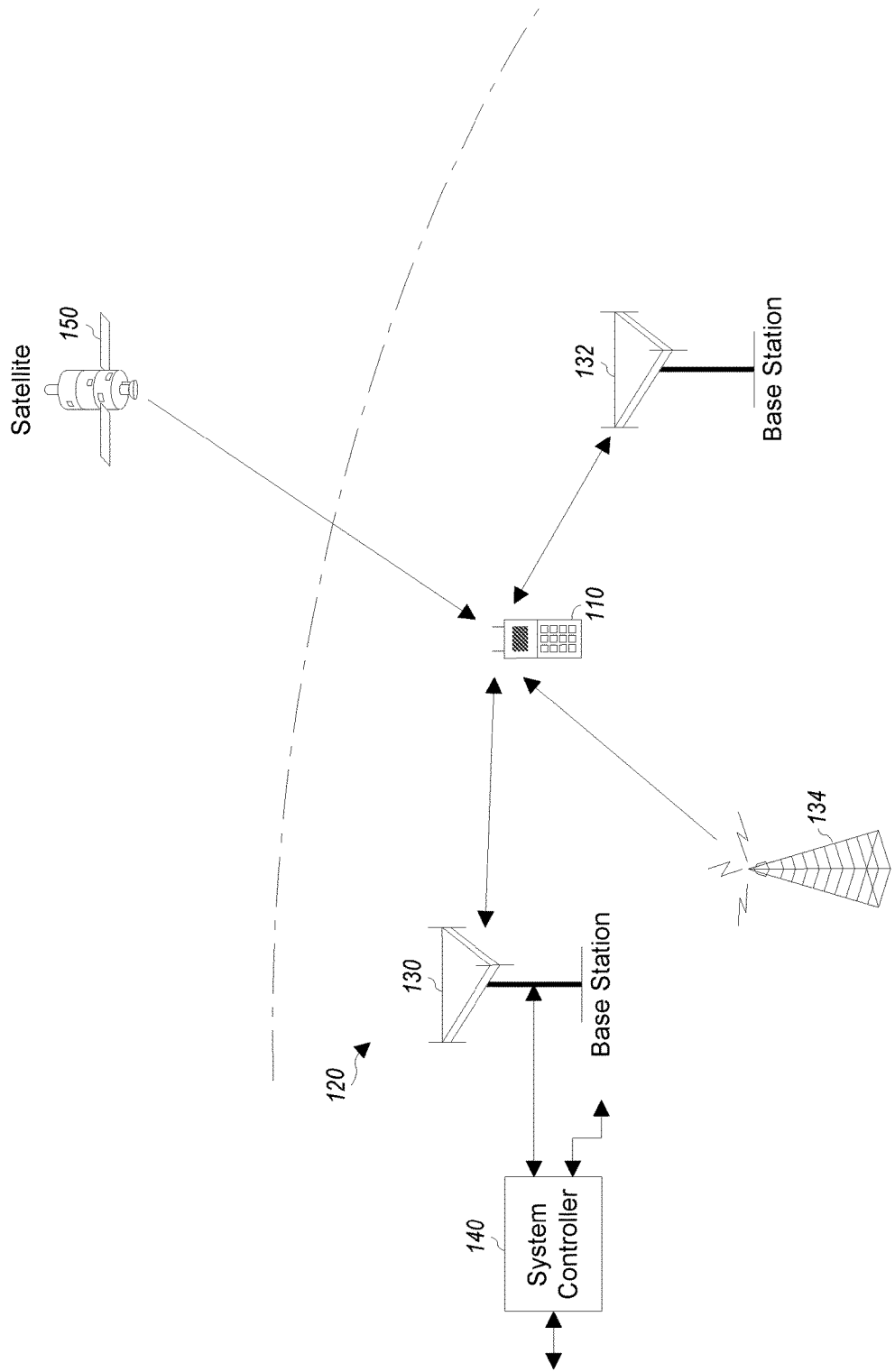
FIG. 1 shows a wireless device communicating with a wireless system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chip design (e.g., mobile RF transceivers) becomes complex at deep sub-micron process nodes due to cost and power consumption considerations. A wireless device (e.g., a cellular phone or a smartphone) in a wireless communication system may include a mobile RF transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

In a mobile RF transceiver, a communication signal is amplified and transmitted by a transmit section. The transmit section may include one or more circuits for amplifying and transmitting the communication signal. The amplifier circuits may include one or more amplifier stages that may have one or more driver stages and one or more amplifier output stages. Each of the amplifier stages includes one or more transistors configured in various ways to amplify the communication signal. One or more of the transistors that are configured to amplify the communication signal are biased based on a number of different parameters and factors.

The basic operation of a receiver in a wireless device including a mobile RF transceiver is as follows. In the receiver, a signal from an antenna is amplified in an RF stage. The output of the RF stage is one input of an RF mixer. A local oscillator (LO) is the other input of the RF mixer. The output of the mixer is a baseband signal if the receiver is a zero intermediate frequency (IF) receiver. The output of the mixer may be an intermediate frequency (IF) signal when the receiver is a heterodyne receiver. A second mixer may convert the IF signal to a baseband signal that is fed to a baseband amplifier. The signal is then demodulated. Depending on various factors, transistors of the baseband amplifier can be configured to operate using one or more bias signals.

Baseband amplifiers in a mobile RF transceiver may be implemented using a class-AB amplifier. Class-AB amplifiers may support low voltage operation while providing support for large signals. An output stage of a class-AB amplifier may include n-type and p-type metal oxide semiconductor (MOS) (NMOS and PMOS) output transistors. Depending on various factors, the class-AB amplifier is configured to operate using a bias signal.

A bias circuit may establish the parameters under which a communication signal is amplified by a class-AB amplifier. Correctly biasing class-AB amplifiers is desirable so that the communication signal may be appropriately amplified. Operation of a baseband amplifier may be adversely affected by a reduced supply voltage in mobile RF transceivers. For example, an issue with class-AB amplifiers is setting a quiescent current in an output stage of the amplifiers, particularly when no signal is present for enabling low power operation.

In particular, correctly biasing a class-AB amplifier is desirable for defining the quiescent current of the amplifier. The quiescent current of an amplifier may be defined as the current consumed by the amplifier when the amplifier is not driving a load and its inputs are static. One technique for setting the quiescent current of a class-AB amplifier uses alternating current (AC)-coupled biasing. Unfortunately, this technique causes the amplifier to exhibit low direct current (DC) gain. This technique also uses a large coupling capacitor to achieve a large passband gain. Other bias techniques fail when a gate voltage of a first (PMOS) transistor is less than the gate voltage of a second (NMOS) output transistor in the output stage of the amplifier.

Aspects of the present disclosure include a class-AB amplifier bias circuit that increases a ratio of a peak current to a quiescent current, while adding minimal, additional current. The bias circuit is configured to sense a voltage (e.g., a common mode/DC voltage) at the gate of a first (PMOS) transistor and compare the voltage with a reference signal for feedback control of a resistor bias current. This inventive aspect provides a well-defined quiescent current over process variations, supply voltage variations, and temperature variations. Additionally, this technique supports low voltage operation when a voltage difference between gates of the output transistors changes sign (positive to negative or vice versa), which may occur frequently due to the reduced supply voltage.

FIG. 1 shows a wireless device 110 communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc. The wireless device 110 may also support carrier aggregation, which is operation on multiple carriers.

Figure 2:
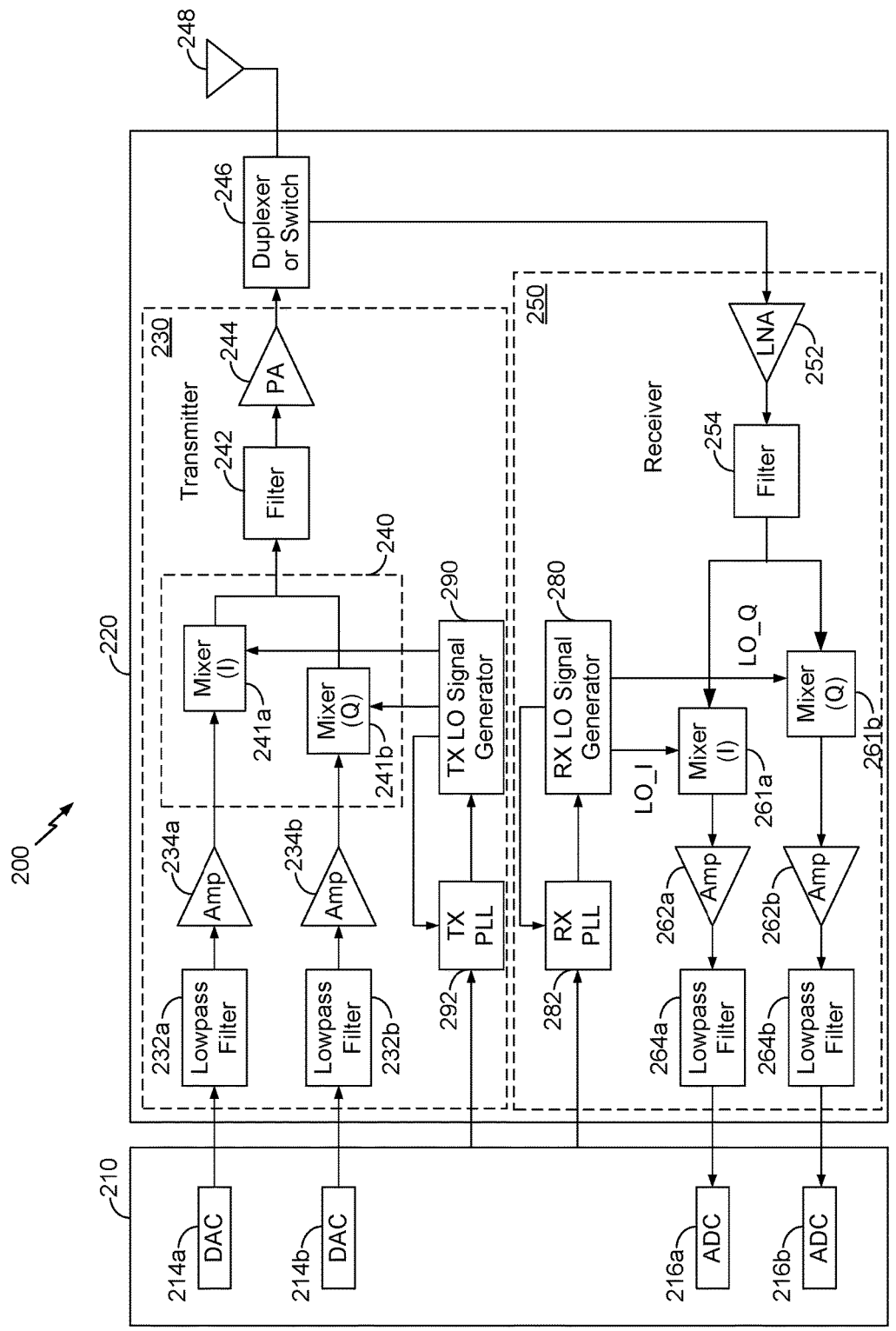
FIG. 2 shows a block diagram of the wireless device in FIG. 1.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog-converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to remove undesired images caused by the prior digital-to-analog conversion. Amplifiers 234a and 234b (Amp) amplify the signals from lowpass filters 232a and 232b, respectively, and provide in-phase (I) and quadrature (Q) baseband signals. Upconverters 240 include an in-phase upconverter 241a and a quadrature upconverter 241b that upconverter the in-phase (I) and quadrature (Q) baseband signals with in-phase (I) and quadrature (Q) transmit (TX) local oscillator (LO) signals from a TX LO signal generator 290 to provide upconverted signals. A filter 242 filters the upconverted signals to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital-converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Amplifiers 234a and 234b and amplifiers 262a and 262b may be implemented as baseband amplifiers. These baseband amplifiers of the wireless device 200 may be implemented with class-AB amplifiers. A class-AB amplifier may support low voltage operation, while providing support for large signals. An output stage of a class-AB amplifier may include n-type and p-type metal oxide semiconductor (MOS) (NMOS and PMOS) output transistors. Depending on various factors, the class-AB amplifier is also configured to operate using bias signals.

A bias circuit may establish the parameters under which a communication signal is amplified by a class-AB amplifier. Operation of a baseband amplifier may be adversely affected by a reduced supply voltage used in mobile RF transceivers. Correctly biasing a class-AB amplifier is desirable so that the communication signal may be appropriately amplified and transmitted to a load. For example, an issue with class-AB amplifiers is setting a standing current in an output stage of the amplifiers, particularly when no signal is present for enabling low power operation. Correctly biasing a class-AB amplifier is desirable for defining a quiescent current of the amplifier, which may be defined as the current consumed by the class-AB amplifier when the class-AB amplifier is not driving a load and its inputs are not cycling.

Figure 3:
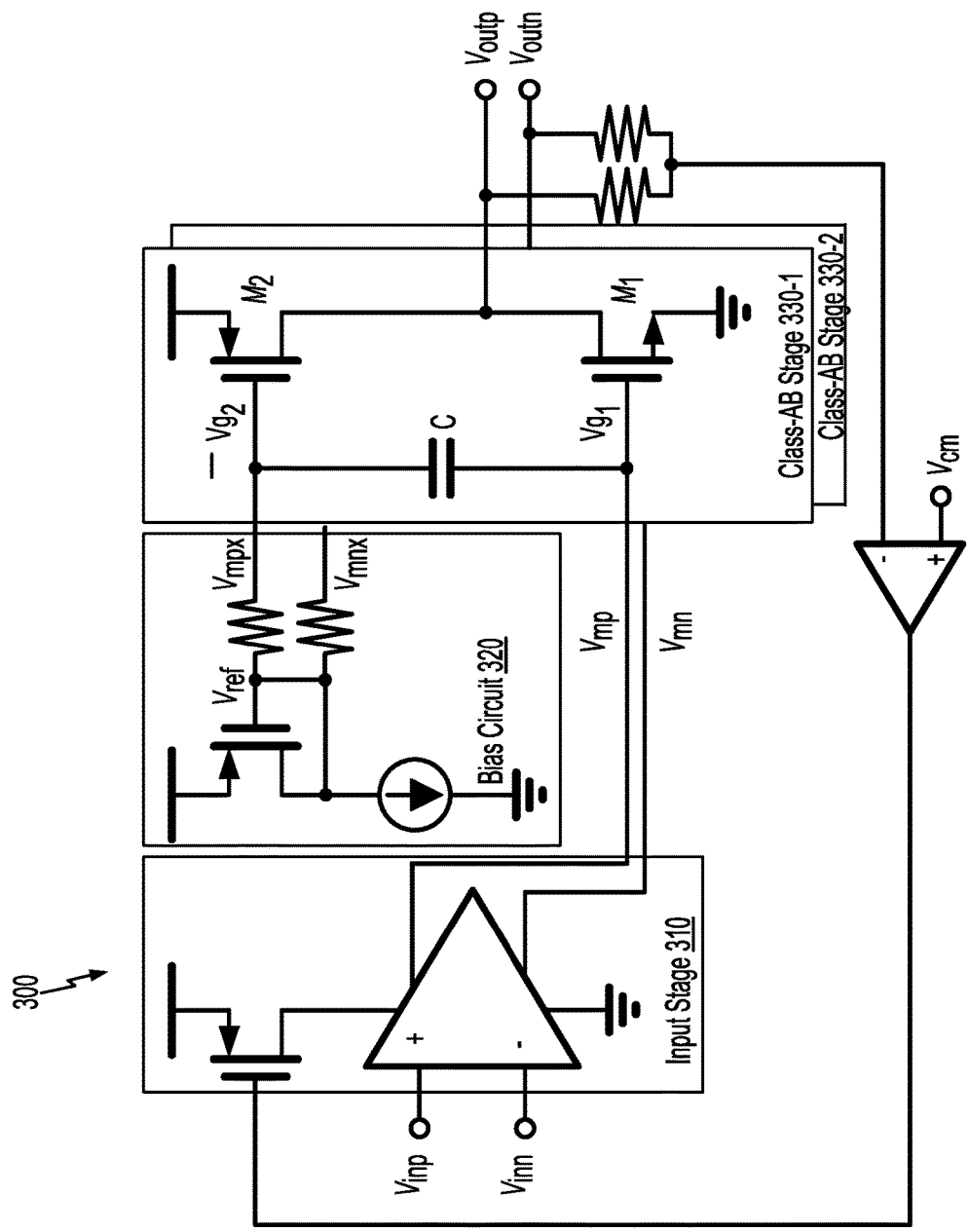
FIG. 3 is a schematic diagram illustrating an exemplary baseband amplifier.

FIG. 3 is a schematic diagram illustrating an amplifier system 300, including a class-AB output stage 330, having a first output stage 330-1 and a second output stage 330-2. As noted above, the amplifier system 300 may be incorporated into a baseband amplifier such as, for example, the amplifiers 234a and 234b and the amplifiers 262a and 262b, as shown in FIG. 2. The amplifier system 300 includes an input stage 310 electrically coupled to the class-AB output stage 330. The amplifier system 300 also includes a bias circuit 320 operatively coupled to the class-AB output stage 330. The class-AB output stage 330 has an n-type metal oxide semiconductor (MOS) (NMOS) output transistor $M_1$ and p-type MOS (PMOS) output transistor $M_2$.

As shown in FIG. 3, the bias circuit 320 uses an alternating current (AC)-coupled biasing technique for defining a quiescent current of the amplifier system 300. Unfortunately, this AC-coupled biasing technique causes the amplifier system 300 to exhibit low direct current (DC) gain. This AC-coupled biasing technique also uses a large coupling capacitor C to achieve a large passband gain. Other bias techniques may fail when a gate voltage $Vg_2$ of the PMOS output transistor $M_2$ is less than the gate voltage $Vg_1$ of the NMOS output transistor $M_1$.

Figure 4A:
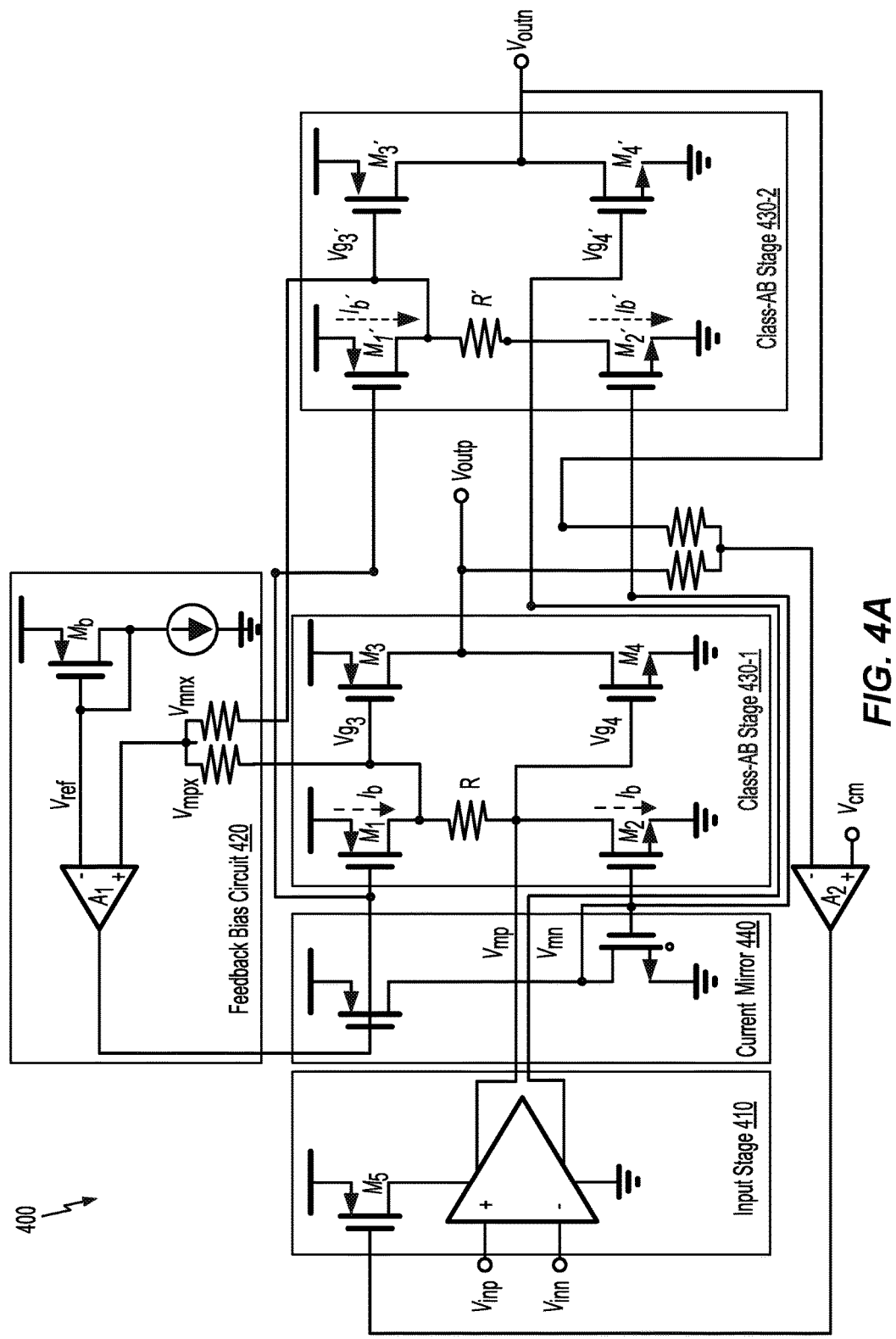
FIG. 4A is a schematic diagram illustrating a baseband amplifier system, including a class-AB output stage having a class-AB amplifier bias circuit, according to aspects of the present disclosure.

Aspects of the present disclosure include a class-AB amplifier bias circuit, for example, as shown in FIG. 4A, for increasing a ratio of a peak current to a quiescent current, while adding little additional current. The bias circuit is configured to sense a voltage (e.g., a common mode/DC voltage) at the gate of a first (PMOS) transistor and compare the voltage with a reference signal for feedback control of a resistor bias current. This inventive aspect provides a well-defined quiescent current over process variations, supply voltage variations, and temperature variations. Additionally, this technique supports low voltage operation when a voltage difference between gates of the output transistors changes sign, which may occur frequently due to the reduced supply voltage.

FIG. 4A is a schematic diagram illustrating a baseband amplifier system 400, including a class-AB output stage amplifier 430 (430-1, 430-2), configured to increase a ratio of a peak current to a quiescent current, according to aspects of the present disclosure. The baseband amplifier system 400 may be incorporated into the amplifiers 234a and 234b and the amplifiers 262a and 262b shown in FIG. 2. The baseband amplifier system 400 includes an input stage amplifier 410 electrically coupled to the class-AB output stage amplifier 430. The baseband amplifier system 400 also includes a feedback bias circuit 420 operatively coupled to the class-AB output stage amplifier 430.

The class-AB output stage amplifier 430 includes a first class-AB stage 430-1, configured to receive a first input voltage (Vmp) and to produce a first output voltage (Voutp). The class-AB output stage amplifier 430 also includes a second class-AB stage 430-2 configured to receive a second input voltage (Vmn) and to produce a second output voltage (Voutn). In a differential configuration, the first output voltage Voutp and the second output voltage Voutn form a differential output signal of the class-AB output stage amplifier 430. The first class-AB stage 430-1 and the second class-AB stage 430-2 are similarly configured as follows. The second class-AB stage 430 is shown in FIG. 4A, but is covered by the first class-AB stage (e.g., 430-1/530-1/630-1/730-1) in FIGS. 4B-7 to avoid obscuring details of the present disclosure.

The first class-AB stage 430-1 and the second class-AB stage 430-2 of the class-AB output stage amplifier 430 include a first polarity (e.g., a p-type MOS (PMOS)) output transistor $M_3/M_3'$ and a second polarity (e.g., an n-type metal oxide semiconductor (MOS) (NMOS)) output transistor $M_4/M_4'$ for the second class-AB stage 430-2. The first class-AB stage 430-1 and the second class-AB stage 430-2 of the class-AB output stage amplifier 430 include a first polarity input transistor $M_1/M_1'$ and a second polarity input transistor $M_2/M_2'$ for the second class-AB stage 430-2. A drain of the first polarity input transistor $M_1/M_1'$ is coupled to a gate of the first polarity output transistor $M_3/M_3'$. In addition, a drain of the second polarity input transistor $M_2$ $M_2/M_2'$ is coupled to a gate of the second polarity output transistor $M_4/M_4'$.

In this configuration, a level shift resistor R/R' is coupled between the drain of the first polarity input transistor $M_1/M_1'$ and the drain of the second polarity input transistor $M_2/M_2'$. In operation, a resistor bias current $I_b/I_b'$ flows through the first polarity input transistor $M_1/M_1'$ and the second polarity input transistor $M_2/M_2'$ for biasing the first polarity output transistor $M_3/M_3'$ and the second polarity output transistor $M_4/M_4'$. The feedback bias circuit 420 may be configured to control the resistor bias current $I_b/I_b'$ for setting a quiescent current that is well defined over process variations, supply voltage variations, and temperature variations at the first class-AB stage 430-1 and the second class-AB stage 430-2 of the class-AB output stage amplifier 430.

In aspects of the present disclosure, the feedback bias circuit 420 is configured to sense a common mode (CM) voltage (e.g., a direct current (DC) voltage) between the gate of the first polarity output transistor M3 of the first class-AB stage 430-1 (e.g., $V_{mpx}$) and the gate of the first polarity output transistor M3' of the second class-AB stage 430-2 (e.g., $V_{mnx}$). The common mode voltage (e.g., an average of a first voltage $V_{mpx}$ for the first class AB stage 430-1 and a second voltage $V_{mnx}$ for the second class AB stage 430-2= $(V_{mpx}+V_{mnx})/2$) is compared with a reference voltage $V_{ref}$. The reference voltage $V_{ref}$ may be set by programming a size of the first polarity bias transistor $M_b$. In this configuration, the common mode voltage (e.g., $(V_{mpx}+V_{mnx})/2$) is compared with the reference voltage $V_{ref}$ at an operational amplifier $A_1$ for providing feedback control of the resistor bias current $I_b$. The output of the operational amplifier $A_1$ is provided to current mirror transistors 440. The current mirror transistors 440 are configured to drive the same resistor bias current $I_b/I_b'$ in the first polarity input transistor $M_1/M_1'$ and the second polarity input transistor $M_2/M_2'$ of the first class-AB stage 430-1 and the second class-AB stage 430-2.

The baseband amplifier system 400 includes the input stage amplifier 410. The baseband amplifier system 400 receives differential input voltages $V_{inp}$ and $V_{inn}$ at the input stage amplifier 410, which are the positive and negative differential input signals. The baseband amplifier system 400 also outputs differential output voltages $V_{outp}$ and $V_{outn}$ at the class-AB output stage amplifier 430, which are the positive and negative differential output signals. The differential output voltages $V_{outp}$ and $V_{outn}$ are sensed by an operational amplifier $A_2$, and compared with a common mode voltage $V_{cm}$. The output of the operational amplifier $A_2$ is fed to a gate of a first polarity input stage transistor $M_5$. The input stage transistor $M_5$ controls the input stage amplifier 410 for generating second stage differential input signals, $V_{mp}$ and $V_{mn}$, which are the positive and negative differential signals at a first stage output and a second stage input.

Figure 4B:
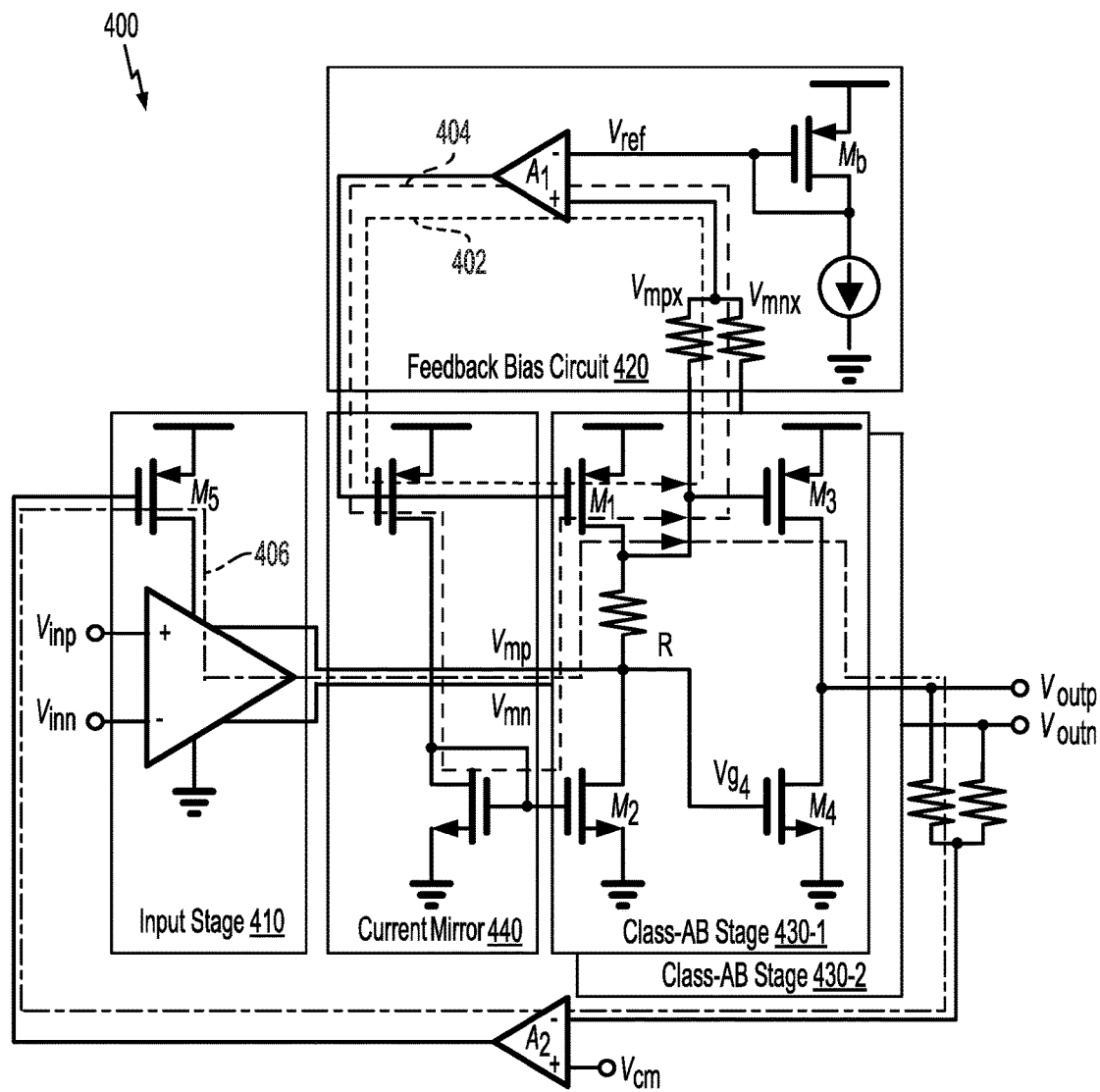
FIG. 4B is a schematic diagram illustrating a loop gain analysis of the baseband amplifier system of FIG. 4A, according to aspects of the present disclosure.

FIG. 4B is a schematic diagram illustrating a loop gain analysis of the baseband amplifier system 400 of FIG. 4A, according to aspects of the present disclosure. FIG. 4B illustrates a first feedback control loop 402 and a second feedback control loop 404. A common mode control feedback loop 406 is also shown. A loop gain of the first feedback control loop 402 may be defined as follows:

$$402 \text{ loop gain} = -A_1 \cdot gm_1 \cdot \frac{r_{01}(R+r_{02})}{r_{01}+(R+r_{02})} \quad (1)$$

In equation (1), $r_{01}$ is the output impedance of $M_1$, $r_{02}$ is the output impedance of $M_2$, $gm_1$ is the transconductance of $M_1$, R is the resistance of the level shift resistor R, and $A_1$ is the gain of the operational amplifier $A_1$. A loop gain of the second feedback control loop 404 may be defined as follows:

$$404 \text{ loop gain} = +A_1 \cdot gm_1 \cdot \frac{r_{01} \cdot r_{02}}{r_{01}+(R+r_{02})} \quad (2)$$

In addition, a combined loop gain of the first feedback control loop 402 and the second feedback control loop 404 may be defined as follows:

$$402+404 \text{ loop gain} = -A_1 \cdot gm_1 \cdot \frac{r_{01} \cdot R}{r_{01}+(R+r_{02})} \quad (3)$$

A loop gain of the common mode control feedback loop 406 may be defined as follows:

$$406 \text{ loop gain} = -gm_3 r_{out2} \cdot A_2 \cdot -gm_5 r_{out1} \cdot \frac{r_{01}}{r_{01}+R} \quad (4)$$

In equation (4), $gm_3$ is the transconductance of $M_3$, $A_2$ is the gain of the operational amplifier $A_2$, $r_{out1}$ is the input impedance of the first stage amplifier (e.g., 410), $r_{out2}$ is the output impedance of the second stage amplifier (e.g., 430), and $gm_5$ is the transconductance of $M_5$.

As noted from equations (1) to (4), the negative loop gain of the first feedback control loop 402, the second feedback control loop 404, the combined loop gain of the first feedback control loop 402 and the second feedback control loop 404, and the loop gain of the common mode control feedback loop 406 ensures feedback control of the resistor bias current $I_b$ at the level shift resistor R. In operation, the level shift resistor R causes a level shift between the first polarity output transistor $M_3$ and the second polarity output transistor $M_4$.

Feedback control of the resistor bias current $I_b$ using the feedback bias circuit 420 to drive the resistor bias current $I_b$ through the level shift resistor R increases a ratio of a peak current to a quiescent current. That is, the level shift resistor R and the resistor bias current $I_b$ work together to set a well-defined quiescent current over process variations, supply voltage variations, and temperature variations. This configuration of the baseband amplifier system 400 presumes that the gate voltage $Vg_3$ of the first polarity output transistor $M_3$ is greater than the gate voltage $Vg_4$ of the second polarity output transistor $M_4$.

Having a gate voltage $Vg_3$ of the first polarity output transistor $M_3$ that is greater than the gate voltage $Vg_4$ of the second polarity output transistor $M_4$ ensures that a value of the resistor bias current $I_b$ is greater than zero ($I_b>0$). Unfortunately, low voltage operation of the baseband amplifier system 400 may cause the gate voltage $Vg_4$ of the second polarity output transistor $M_4$ to exceed the gate voltage $Vg_3$ of the first polarity output transistor $M_3$, resulting in a sign change of the resistor bias current $I_b$ (e.g., $I_b<0$). That is, the resistor biasing provided by the level shift resistor R fails when the gate voltage $Vg_3$ of the first polarity output transistor $M_3$ falls below the gate voltage $Vg_4$ of the second polarity output transistor $M_4$ due to the sign change of the resistor bias current $I_b$.

Figure 5:
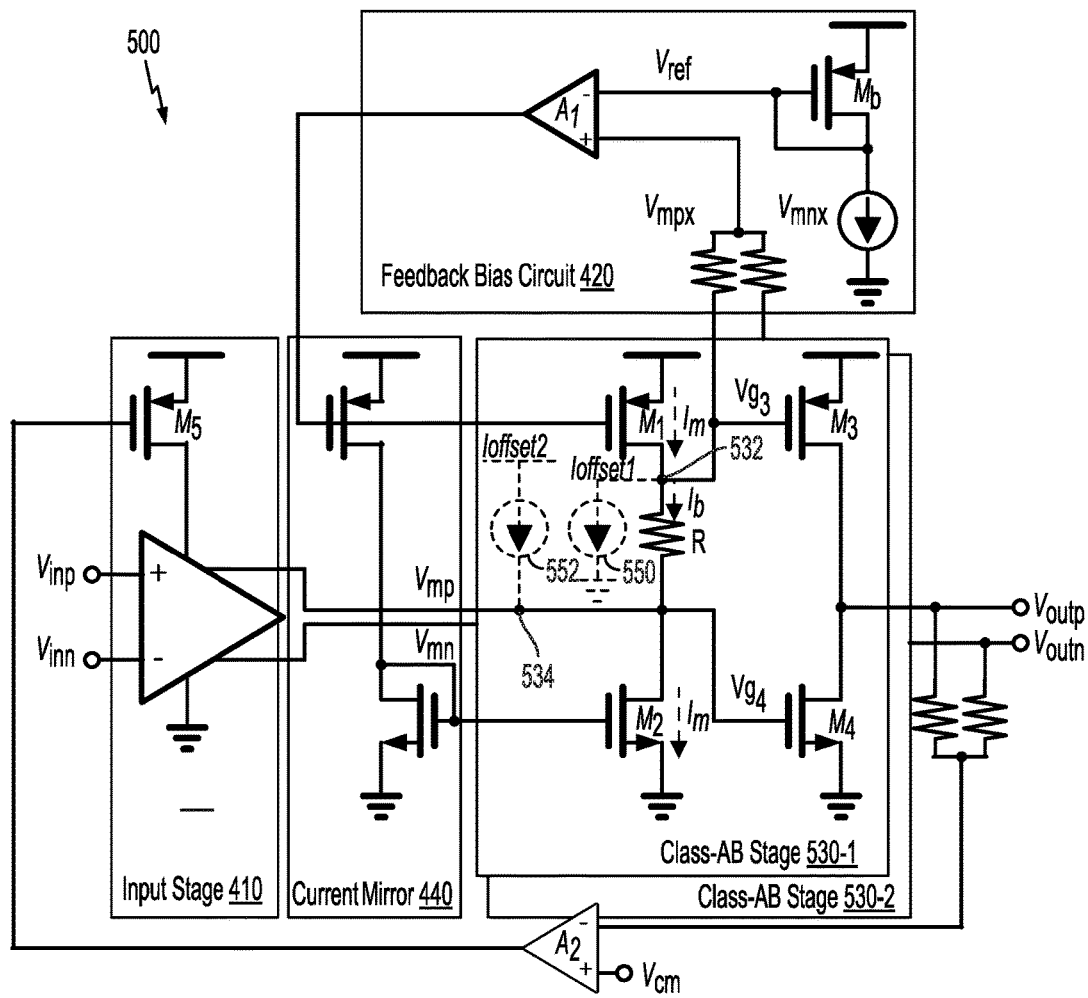
FIG. 5 is a schematic diagram illustrating a baseband amplifier system, including a class-AB output stage having a class-AB amplifier bias circuit including constant current sources, according to aspects of the present disclosure.

FIG. 5 is a schematic diagram illustrating a baseband amplifier system 500, including a class-AB output stage amplifier 530 (e.g., a first class-AB stage 530-1 and a second class-AB stage 530-2), having a first constant current $I_{offset1}$ and a second constant current $I_{offset2}$, according to aspects of the present disclosure. In this aspect of the present disclosure, the pair of constant currents $I_{offset1}$ and $I_{offset2}$ are injected/drawn into/drawn the class-AB output stage amplifier 530 to induce a current $I_m$ through the first polarity input transistor $M_1$ and the second polarity input transistor $M_2$. The pair of constant currents $I_{offset1}$ and $I_{offset2}$ enable the total current $I_m$ to be greater than zero and to flow through $M_1$ and $M_2$ even if $Vg_4$ is greater than $Vg_3$, in which case the bias current $I_b$ flows from the drain of $M_2$ to the drain of $M_1$. $I_m$, $I_{offset}$, and $I_b$ are related by the following equation, in which $I_{offset}=I_{offset1}=I_{offset2}$:

$$I_b=I_m-I_{offset} \quad (5)$$

In this configuration, a first programmable current driving circuitry 550 draws the first constant current $I_{offset1}$ from a node 532 of the level shift resistor R. A second programmable current driving circuitry 552 injects the second constant current $I_{offset2}$ into a node 534 of the level shift resistor R. The magnitude of the first constant current source $I_{offset1}$ and the second constant current $I_{offset2}$ are selected to induce the current $I_m$ through the first polarity input transistor $M_1$ and the second polarity input transistor $M_2$. That is, $I_{offset1}$ and $I_{offset2}$ are selected such that these values are larger than the largest anticipated value of $I_b$ to ensure that a non-zero current $I_m$ flows through the level shift resistor R from the drain of $M_1$ to the drain of $M_2$. As a result, the feedback control provided by the feedback bias circuit 420 continues to run over process corners, in which low voltage operation causes a sign change of the resistor bias current $I_b$ (e.g., $I_b$<0).

This current injection technique supports low voltage operation when a voltage difference between gates of the first polarity output transistor $M_3$ and the second polarity output transistor $M_4$ changes sign, which may occur frequently due to a reduced supply voltage for low voltage operation. Accordingly, this bias technique does not fail when the gate voltage $Vg_3$ of the first polarity output transistor $M_3$ is less than the gate voltage $Vg_4$ of the second polarity output transistor $M_4$. Furthermore, no additional switches or operational amplifiers are used in the current injection technique, other than the constant current sources $I_{offset}$. This current injection technique prevents a biasing interruption from occurring during a sign change of the resistor bias current $I_b$.

Figure 6B:
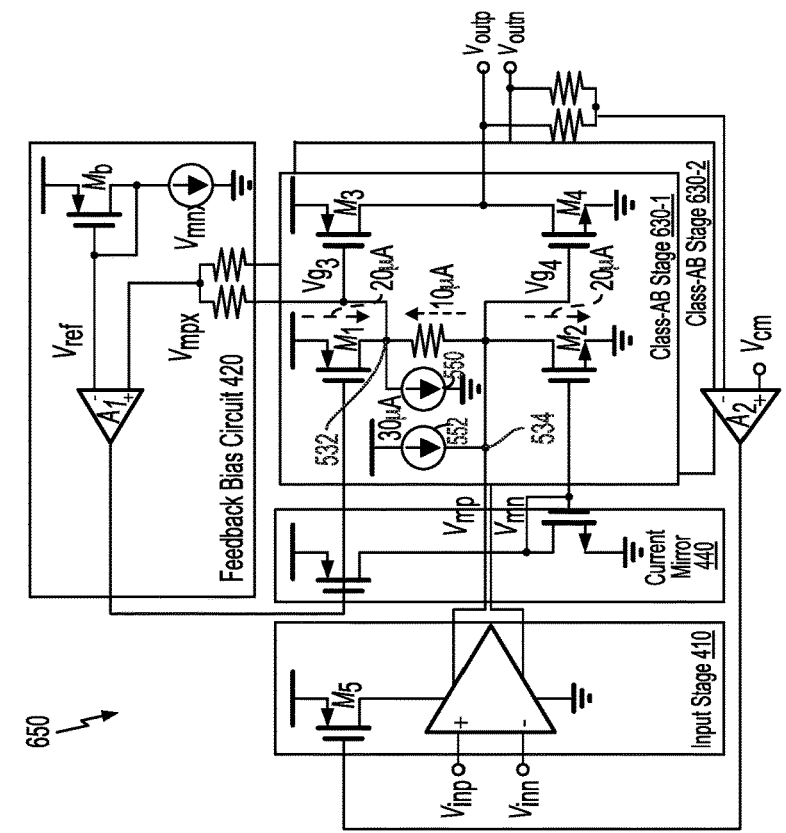
FIG. 6B is a schematic diagram illustrating the baseband amplifier system similar to FIG. 5, including a class-AB output stage having first exemplary constant current source values, according to aspects of the present disclosure.
Figure 6A:
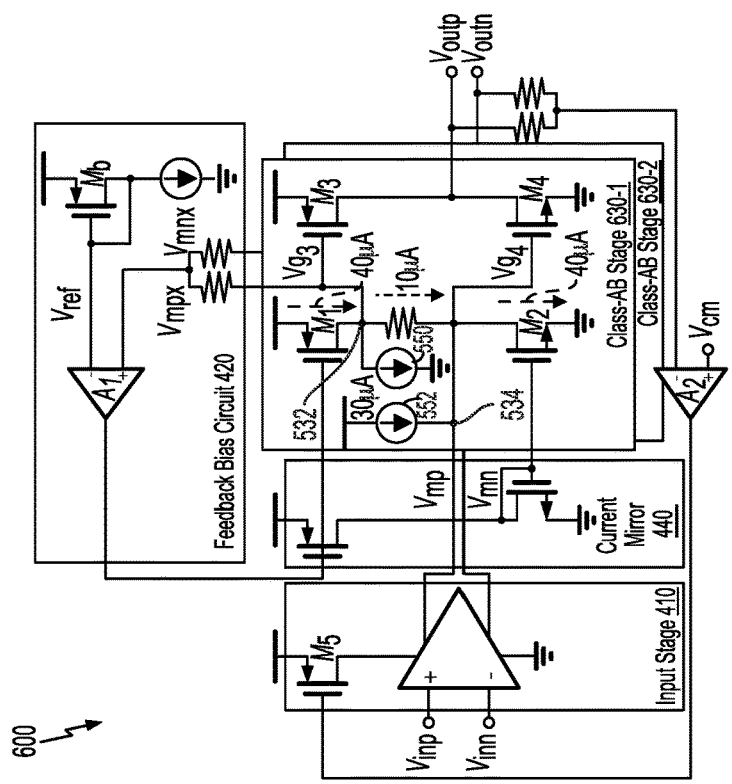
FIG. 6A is a schematic diagram illustrating the baseband amplifier system similar to FIG. 5, including a class-AB output stage having first exemplary constant current source values, according to aspects of the present disclosure.

FIG. 6A is a schematic diagram illustrating a baseband amplifier system 600 similar to FIG. 5, including a first class-AB output stage 630-1 and a second class-AB output stage 630-2, operating under exemplary constant currents, according to aspects of the present disclosure. In this example, the first constant current $I_{offset1}$ is set to thirty milliamps (30 µA) and the induced current $I_m$ is forty milliamps (40 µA). Because the induced current $I_m$ is greater than the $I_{offset1}$ current, the resistor bias current $I_b$ (=10 µA, per equation (5)) maintains its positive sign. The resistor bias current $I_b$, therefore, continues to flow from the first polarity output transistor $M_3$ to the second polarity output transistor $M_4$ because the gate voltage $Vg_3$ of the first polarity output transistor $M_3$ is greater than the gate voltage $Vg_4$ of the second polarity output transistor $M_4$. In this example, the gate voltage is negative because the gate voltage $Vg_4$ of the second polarity output transistor $M_4$ is greater than the gate voltage $Vg_3$ of the first polarity output transistor $M_3$.

FIG. 6B is a schematic diagram illustrating a baseband amplifier system 650 similar to FIG. 5, including a first class-AB stage 630-1 and a second class-AB stage 630-2 operating under exemplary constant currents, according to further aspects of the present disclosure. In this example, the first constant current $I_{offset1}$ and the second constant current are also set to thirty milliamps (30 µA). The induced current $I_m$, however, falls to twenty milliamps (20 µA) due to, for example, low voltage operation of the baseband amplifier system 650. Because the induced current $I_m$ is less than the $I_{offset1}$ current, the resistor bias current $I_b$ (−10 µA, per equation (5)) has changed sign to a negative value. As a result, the resistor bias current $I_b$ has changed direction, flowing from the second polarity output transistor $M_4$ to the first polarity output transistor $M_3$ because the gate voltage $Vg_4$ is greater than the gate voltage $Vg_3$.

Because the induced current $I_m$ is always greater than zero, however, the resistor bias current $I_b$ may change sign without negatively affecting biasing of the first polarity output transistor $M_3$ or the second polarity output transistor $M_4$.

Figure 7:
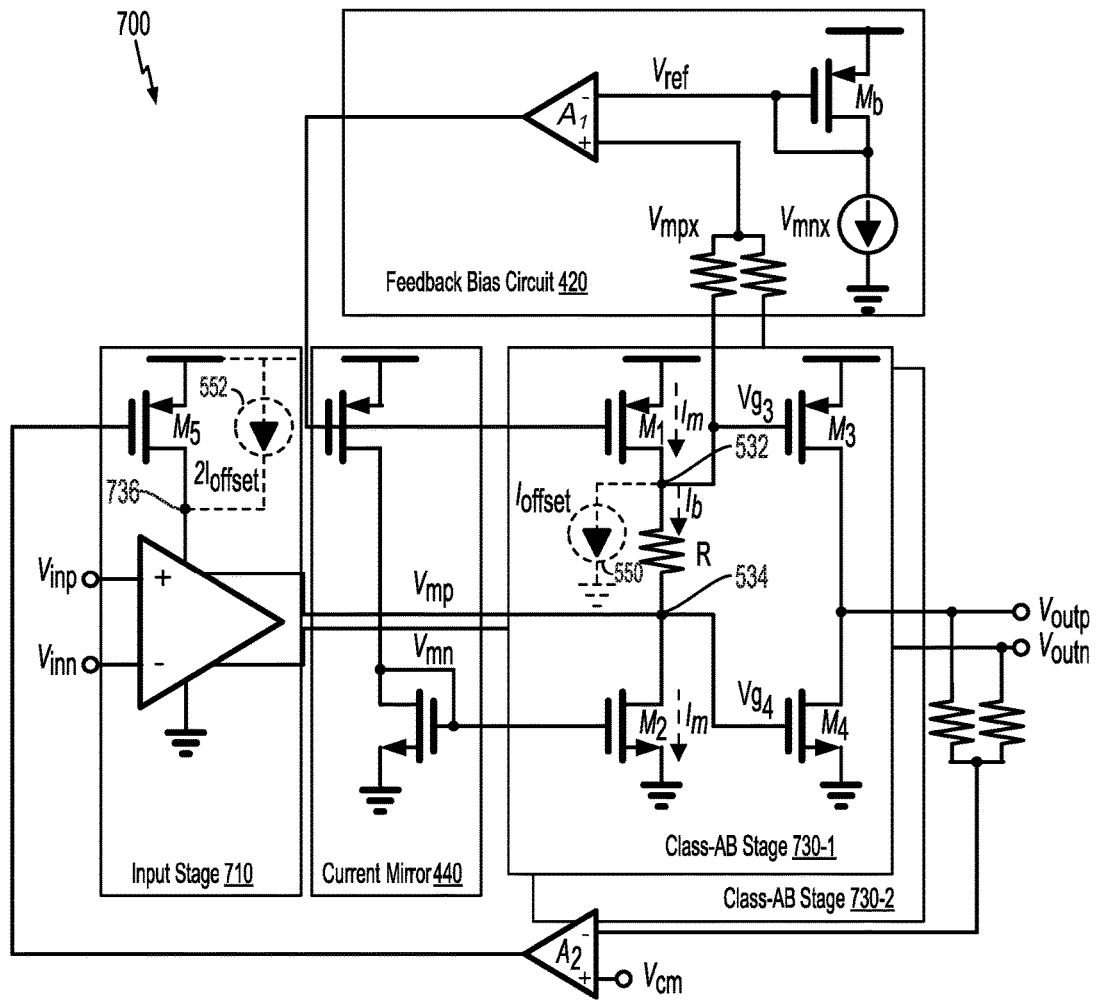
FIG. 7 is a schematic diagram illustrating a baseband amplifier system, including a class-AB output stage having constant current sources $2I_{offset}$ and $I_{offset}$, according to a further aspect of the present disclosure.

FIG. 7 is a schematic diagram illustrating a baseband amplifier system 700, including a first class-AB stage 730-1 and a second class-AB stage 730-2, having constant currents $2I_{offset}$ and $I_{offset}$, according to a further aspect of the present disclosure. Similar to the configuration shown in FIG. 5, a pair of constant currents are injected/drawn into/from the baseband amplifier system 700. In the configuration shown in FIG. 7, however, the constant current $2I_{offset}$ is injected into a common-mode node 736 of the input stage amplifier 710 to induce the current $I_m$ in the second polarity input transistor $M_2$. Similar to the configuration of FIG. 5, the constant current $I_{offset}$ is drawn from the input terminal 532 of the level shift resistor R to induce the current $I_m$ the second polarity input transistor $M_2$. The current $I_m$ enables the resistor bias current $I_b$ to change sign, while the current $I_m$ is greater than zero, according to the equation (5) above. The baseband amplifier system 700 of FIG. 7 may be selected instead of the configuration shown in FIG. 5 to improve noise reduction.

Figure 8:
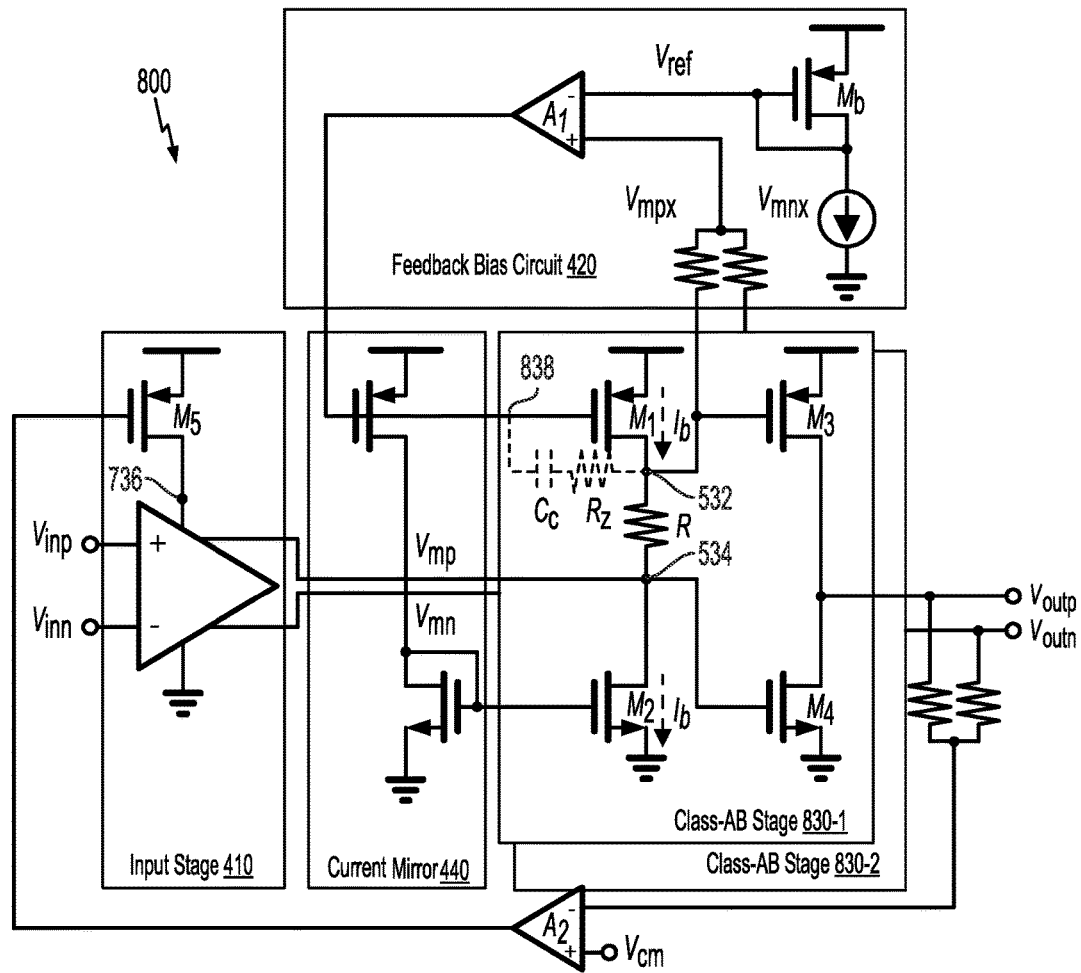
FIG. 8 is a schematic diagram illustrating a baseband amplifier system, including a class-AB output stage having Miller compensation components, according to aspects of the present disclosure.

FIG. 8 is a schematic diagram illustrating a baseband amplifier system 800, including a first class-AB stage 830-1 and a second class-AB stage 830-2, having Miller compensation components, according to aspects of the present disclosure. The baseband amplifier system 800 may be similar to the baseband amplifier system 400 shown in FIG. 4A. In this configuration shown in FIG. 8, however, a capacitor $C_c$ and a resistor $R_z$ are coupled in series between the gate (e.g., node 838) of the first polarity input transistor $M_1$ and the input terminal 532 of the bias resistor R. The capacitor $C_c$ and a resistor $R_z$ provide Miller compensation components to the class-AB output stage amplifier 830. The baseband amplifier system 800 of FIG. 8 may be selected instead of the configuration of the baseband amplifier system 400 shown in FIG. 4A to improve stability. A process for biasing a class-AB amplifier is shown in FIG. 9.

Figure 9:
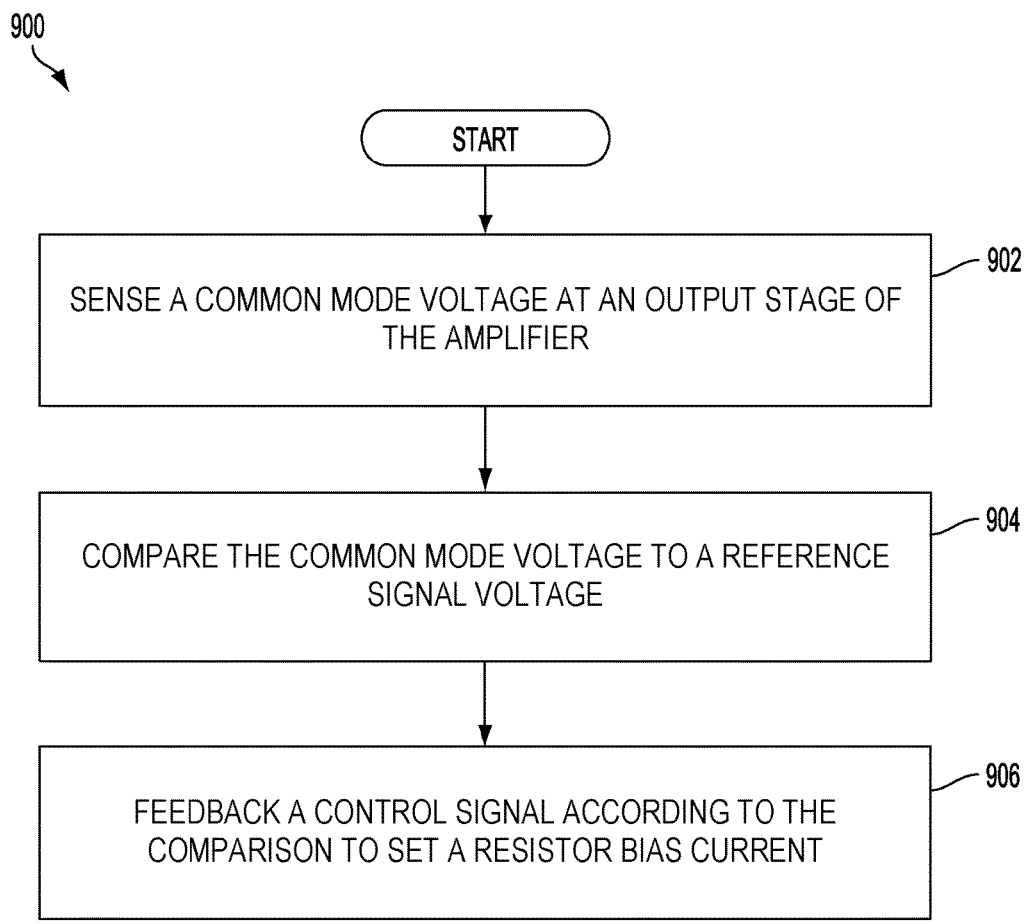
FIG. 9 is a flow diagram illustrating a method of biasing a baseband amplifier, in accordance with aspects of the present disclosure.

FIG. 9 is a flow diagram illustrating a method 900 for biasing a baseband (e.g., a class-AB) amplifier, in accordance with aspects of the present disclosure. The blocks in the method 900 can be performed in or out of the order shown, and in some aspects, can be performed at least in part in parallel.

At block 902, a common mode voltage of an output stage of the amplifier is sensed. For example, as shown in FIG. 4B, the feedback bias circuit 420 is configured to sense a common mode (CM) voltage between the gate of the first polarity output transistor M3 of the first class-AB stage 430-1 (e.g., $V_{mpx}$) and the gate of the first polarity output transistor M3' of the second class-AB stage 430-2 (e.g., $V_{mnx}$). The common mode voltage (e.g., an average of a first voltage $V_{mpx}$ for the first class AB stage 430-1 and a second voltage $V_{mnx}$ for the second class AB stage 430-2=($V_{mpx}$+$V_{mnx}$)/2) is compared with a reference voltage $V_{ref}$. At block 904, the sensed voltage is compared with a reference signal voltage. For example, as shown in FIG. 4A, the operational amplifier $A_1$ compares the sensed voltage with a reference voltage $V_{ref}$. At block 906, a control signal is fed back according to the comparison to set a resistor bias current. For example, as shown in FIG. 4B, the operational amplifier $A_1$ generates a control signal as feedback to set the bias current $I_b$ through the level shift resistor R for biasing the output transistor $M_3$ and the output transistor $M_4$.

A bias circuit may establish the parameters under which a communication signal is amplified by a class-AB amplifier. Correctly biasing class-AB amplifiers is desirable so that the communication signal may be appropriately amplified and transmitted to a load. Operation of a baseband amplifier may be adversely affected by a reduced supply voltage in mobile RF transceivers. For example, an issue with class-AB amplifiers is setting a standing current in an output stage of the amplifiers, particularly when no signal is present for enabling low power operation.

Aspects of the present disclosure include a class-AB amplifier bias circuit that increases a ratio of a peak current to a quiescent current, while adding minimal, additional current. The bias circuit is configured to sense a common mode voltage at between differential output stages of the amplifier and compare the common mode voltage with a reference signal for control of a resistor bias current conducted by a level shift resistor. This inventive aspect provides a well-defined quiescent current over process variations, supply voltage variations, and temperature variations. Additionally, this technique supports low voltage operation when a voltage difference between gates of the PMOS output transistor and an NMOS output transistor changes sign (positive to negative or vice versa), which may occur frequently due to the reduced supply voltage.

According to a further aspect of the present disclosure, a bias circuit for an amplifier is described. The bias circuit includes means for sensing a common mode voltage at the output stage of the amplifier and comparing the common mode voltage with a reference signal to feedback control a resistor bias current conducted by a level shift resistor. The means for sensing may, for example, include the operational amplifier $A_1$, as shown in FIG. 4B. In another aspect, the aforementioned means may be any module, or any apparatus configured to perform the functions recited by the aforementioned means.

Figure 10:
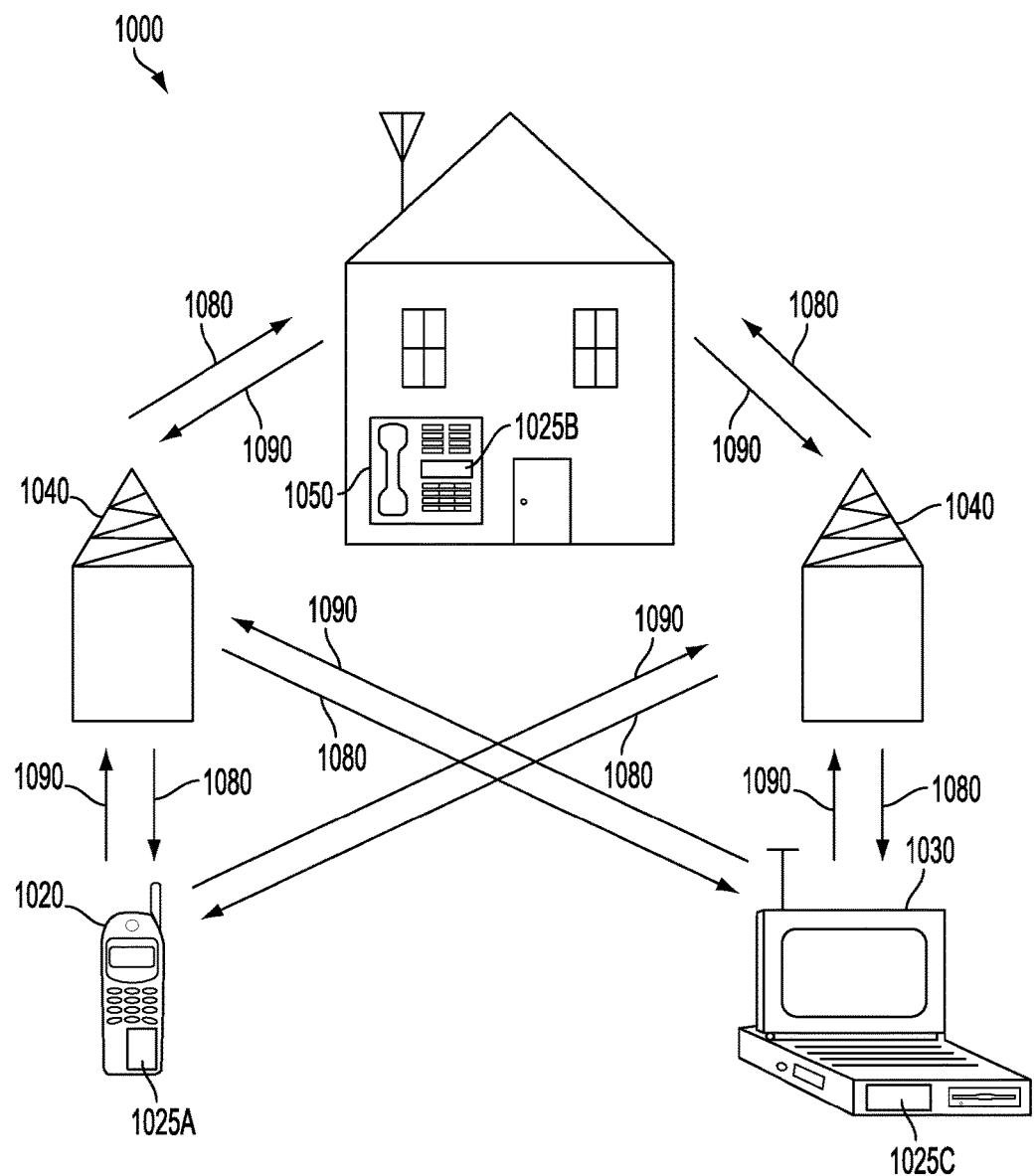
FIG. 10 is a block diagram showing an exemplary wireless communication system in which an aspect of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed adaptive bias circuit. It will be recognized that other devices may also include the disclosed adaptive bias circuit, such as the base stations, user equipment, and network equipment. FIG. 10 shows forward link signals 1080 from the base station 1040 to the remote units 1020, 1030, and 1050 and reverse link signals 1090 from the remote units 1020, 1030, and 1050 to base station 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed adaptive bias circuit.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects, which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:

1. An amplifier, comprising:
   a first transistor;
   a second transistor coupled to the first transistor in an output stage of the amplifier;
   a level shift resistor coupled between a gate of the first transistor and a gate of the second transistor; and
   a feedback bias circuit coupled to the gate of the first transistor and the gate of the second transistor through the level shift resistor, the feedback bias circuit configured to sense a common mode voltage of the output stage of the amplifier and to compare the common mode voltage with a reference voltage to control a resistor bias current conducted by the level shift resistor.

2. The amplifier of claim 1, further comprising a first constant current and a second constant current, the first constant current drawn from a gate of the first transistor, and the second constant current source injected into a gate of the second transistor.

3. The amplifier of claim 1, further comprising:
   first current driving circuitry; and
   second current driving circuitry, the first programmable current driving circuitry coupled to a gate of the first transistor, and the second programmable current driving circuitry coupled to a gate of the second transistor, the first programmable current driving circuitry configured to inject a current into a node connected to the first transistor and the second programmable current driving circuitry configured to draw a current from a node connected to the second transistor.

4. The amplifier of claim 1, further comprising:
   first current driving circuitry; and
   second current driving circuitry, the first current driving circuitry coupled to a gate of the first transistor, and the second programmable current driving circuitry coupled to a common-mode node of an input stage amplifier.

5. The amplifier of claim 1, in which the output stage comprises:
   a first output stage including the first transistor and the second transistor configured to drive a first output signal; and
   a second output stage comprising a third transistor coupled to a fourth transistor and configured to drive a second output signal, in which the first output signal and the second output signal comprise a differential output signal of the amplifier.

6. The amplifier of claim 1, in which the amplifier comprises a class-AB amplifier.

7. The amplifier of claim 1, further comprising Miller compensation components coupled in series between a gate of a first input transistor and the gate of the first transistor.

8. The amplifier of claim 1, in which the feedback bias circuit comprises an operational amplifier configured to compare the common mode voltage at the output stage of the amplifier with the reference voltage to feedback control the resistor bias current conducted by the level shift resistor to cause a level shift between the first transistor and the second transistor.

9. The amplifier of claim 1, in which the first transistor comprises a p-type metal oxide semiconductor (PMOS) output transistor, and the second transistor comprises an n-type metal oxide semiconductor (NMOS) output transistor.

10. A method of biasing an amplifier, comprising:
    sensing a common mode voltage of an output stage of the amplifier;
    comparing the common mode voltage to a reference signal voltage;
    feeding back a control signal according to the comparing to set a resistor bias current;
    drawing a first constant current from a gate of a first transistor in the output stage of the amplifier; and
    injecting a second constant current into a gate of a second transistor coupled to the first transistor.

11. The method of claim 10, further comprising:
    injecting the second constant current into a common-mode node of an input stage amplifier.

12. The method of claim 10, in which sensing the common mode voltage comprises:
    determining an average voltage at a node coupled to a first amplifier output stage and a second amplifier output stage.

13. The method of claim 10, in which sensing comprises sensing a direct current (DC) voltage at the first transistor.

14. An amplifier, comprising:
    a first transistor;
    a second transistor;
    a bias circuit coupled to a gate of the first transistor and a gate of the second transistor, the bias circuit comprising a resistor between the gate of the first transistor and the gate of the second transistor, the bias circuit comprising means for sensing a common mode voltage of the output stage of the amplifier and comparing the common mode voltage with a reference signal to control a resistor bias current conducted by a level shift resistor coupled between a gate of the first transistor and a gate of the second transistor; and
    a first constant current and a second constant current, the first constant current drawn from the gate of the first transistor, and the second constant current drawn from the gate of the second transistor, the first constant current having an opposite direction from the second constant current source.

15. The amplifier of claim 14, further comprising:

first current driving circuitry, the first programmable current driving circuitry connected to the gate of the first transistor; and second current driving circuitry, the second programmable current driving circuitry connected to a gate of the second transistor, the first programmable current driving circuitry having an opposite current direction from the second programmable current driving circuitry.

16. The amplifier of claim 14, in which the means for sensing further comprises means for determining an average voltage at a node coupled to the first output stage and the second output stage.

17. The amplifier of claim 14, in which the amplifier comprises a class-AB amplifier.

18. The amplifier of claim 14, in which the first transistor comprises a p-type metal oxide semiconductor (PMOS) output transistor, and the second transistor comprises an n-type metal oxide semiconductor (NMOS) output transistor.

* * * * *